United States Patent
Mandel

(10) Patent No.: US 6,700,195 B1
(45) Date of Patent: Mar. 2, 2004

(54) ELECTRONIC ASSEMBLY FOR REMOVING HEAT FROM A FLIP CHIP

(75) Inventor: Larry M Mandel, Noblesville, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/397,601

(22) Filed: Mar. 26, 2003

(51) Int. Cl.⁷ .................................................. H01L 23/34
(52) U.S. Cl. ........................................ 257/718; 257/706
(58) Field of Search ................................ 257/718, 719, 257/714, 706, 707, 711, 713

(56) References Cited

U.S. PATENT DOCUMENTS

| | | | |
|---|---|---|---|
| 3,264,524 A | 8/1966 | Dahlgren et al. | 317/101 |
| 3,409,732 A | 11/1968 | Dahlgren et al. | 174/68.5 |
| 4,800,461 A | 1/1989 | Dixon et al. | 361/398 |
| 4,887,149 A * | 12/1989 | Romano | |
| 5,396,403 A * | 3/1995 | Patel | |
| 5,646,826 A * | 7/1997 | Katchmar | |
| 6,156,980 A | 12/2000 | Peugh et al. | 174/252 |
| 6,180,045 B1 | 1/2001 | Brandenburg et al. | 264/263 |
| 6,180,436 B1 | 1/2001 | Koors et al. | 438/117 |
| 6,307,749 B1 | 10/2001 | Daanen et al. | 361/704 |
| 6,365,964 B1 * | 4/2002 | Koors et al. | |
| 6,545,351 B1 * | 4/2003 | Jamieson et al. | |
| 6,560,110 B1 | 5/2003 | Myers et al. | |
| 6,570,247 B1 * | 5/2003 | Eiles et al. | |

* cited by examiner

*Primary Examiner*—Sheila V. Clark
(74) *Attorney, Agent, or Firm*—Jimmy L. Funke; Stefan V. Chmielewski

(57) ABSTRACT

An electronic assembly for conducting heat from a semiconductor device, such as a power flip chip, attached to a substrate. The substrate has a first region with conductors thereon, a second region surrounding and supporting the first region, and a third region surrounding and supporting the second region, with the second region being more flexible than the first and third regions. The chip is mounted to the first region of the substrate, and has solder connections on a first surface thereof that are registered with the conductors on the first region of the substrate. A heat-conductive member thermally contacts a second surface of the chip oppositely disposed from the first surface. A biasing element contacts the first region of the substrate to bias the chip into thermal contact with the heat-conductive member.

20 Claims, 1 Drawing Sheet

ELECTRONIC ASSEMBLY FOR REMOVING HEAT FROM A FLIP CHIP

CROSS REFERENCE TO RELATED APPLICATIONS

Not applicable.

STATEMENT REGARDING FEDERALLY SPONSORED RESEARCH

Not applicable.

BACKGROUND OF THE INVENTION

(1) Field Of The Invention

The present invention generally relates to thermal management of semiconductor devices. More particularly, this invention relates to an electronic assembly that dissipates heat from a flip chip, and also improves the life expectancy of the chip by reducing induced strains in the chip and its solder connections.

(2) Description Of The Related Art

Power flip chips and certain other semiconductor devices require thermal management in order to minimize their operating temperatures. A variety of techniques have been developed for dissipating heat generated by power flip chips. One such technique is disclosed in commonly-assigned U.S. Pat. Nos. 6,180,436 and 6,365,964 to Koors et al., and involves conducting heat from a power flip chip with a heat-conductive pedestal brought into thermal contact with the topside of the chip, i.e., the surface opposite the solder connections that attach the chip to its substrate. A thermally-conductive lubricant is placed between the topside of the chip and the pedestal to fill gaps between the chip and pedestal in order to promote thermal contact, as well as decouple lateral mechanical strains that arise as a result of different thermal expansions and movement between the chip, substrate and pedestal.

While the approach taught by Koors et al. has been successfully implemented, induced stresses can be sufficiently high under severe conditions to fracture the solder connections and even the chip die. Furthermore, thermally-conductive lubricants suitable for placement between a chip and pedestal typically contain a hard particulate filler that can abrade the chip, and the thermal performance of such lubricants is typically compromised as a result of the compositional requirements necessary to achieve adequate lubricity. Finally, thermal energy could be more efficiently dissipated if the contact interface resistance between the chip and pedestal could be reduced.

BRIEF SUMMARY OF THE INVENTION

The present invention is directed to an electronic assembly for conducting heat from a semiconductor device, such as a power flip chip. The assembly is generally constructed to dissipate heat from a chip mounted to a substrate, preferably a laminate such as a printed wiring board (PWB). The substrate has a first region with conductors thereon, a second region surrounding and supporting the first region, and a third region surrounding and supporting the second region, with the second region being more flexible than the first and third regions. The chip is mounted to the first region of the substrate, and has solder connections on a first surface thereof that are registered with the conductors on the first region of the substrate. A heat-conductive member thermally contacts a second surface of the chip oppositely disposed from the first surface. Biasing means contacts the first region of the substrate for biasing the chip into thermal contact with the heat-conductive member.

A significant advantage of the electronic assembly of this invention is that the second region of the substrate improves the mechanical decoupling of strains that arise as a result of different thermal expansions and movement between the chip, substrate, and heat-conductive member, thereby reducing the induced stresses that can cause fracturing of the chip and its solder connections. Induced strains are reduced by the second ("flex") region of the substrate because the chip is located on a separate island of "rigid" substrate, namely, the first region. The size and mass of the first region can be small, adapted to support a single chip. As such, stresses resulting from chip-to-chip stack-up tolerances can be completely eliminated. Furthermore, the flexibility of the substrate is able to tolerate greater variances in the dimensions of the heat-conductive member, such that fabrication tolerances can be relaxed.

Another advantage of the invention is that, because of the significantly lower induced stresses, a lubricant property is not required between the chip and heat-conductive member. Elimination of this restriction opens up the possibility for using a variety of other materials having better thermal properties than thermally-conductive lubricants. In particular, highly-conductive materials can be used that reduce the tendency for the chip to be abraded during the life of the assembly. Yet another advantage is that a thicker substrate than Koors et al. becomes practical because the chip-to-chip tolerance that would otherwise be taken up by the flexing of a thin laminate substrate can be fully taken up by the flexible second region of the present invention.

Other objects and advantages of this invention will be better appreciated from the following detailed description.

DETAILED DESCRIPTION OF THE INVENTION

Figure 1:
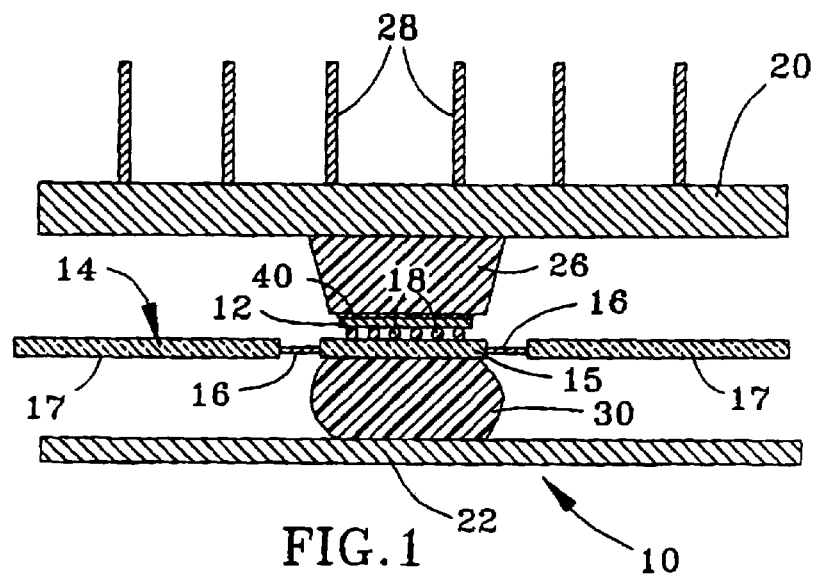
FIG. 1 is a cross-sectional view of a housing enclosing a power flip chip mounted to a substrate, with a heat-conductive pedestal contacting the topside of the chip.

FIG. 1 shows an electronic assembly 10 containing a power flip chip 12 attached to a substrate 14. The assembly 10 includes a housing formed by two housing members 20 and 22 that enclose the chip 14 and substrate 14. Mounting of the chip 12 to the substrate 14 can be performed by conventional flip-chip techniques, in which preformed solder bumps on the frontside of the chip 12 (the surface of the chip 12 on which the flip chip microcircuitry is formed) are registered with and reflow soldered to conductors 44 (FIG. 2) on the surface of the substrate 14 to yield solder connections 18. The chip 12 may be underfilled with a suitable polymeric material (not shown), as is conventionally done in the art to promote the thermal cycle life of the solder connections 18. While a single chip 12 is depicted in FIG. 1, any number of chips could be attached to the substrate 14 and enclosed within the housing. Furthermore, while a power flip chip is illustrated, the present invention is generally directed to any type of heat-generating device that utilizes solder connections to provide physical and electrical connection to a substrate.

Figure 2:
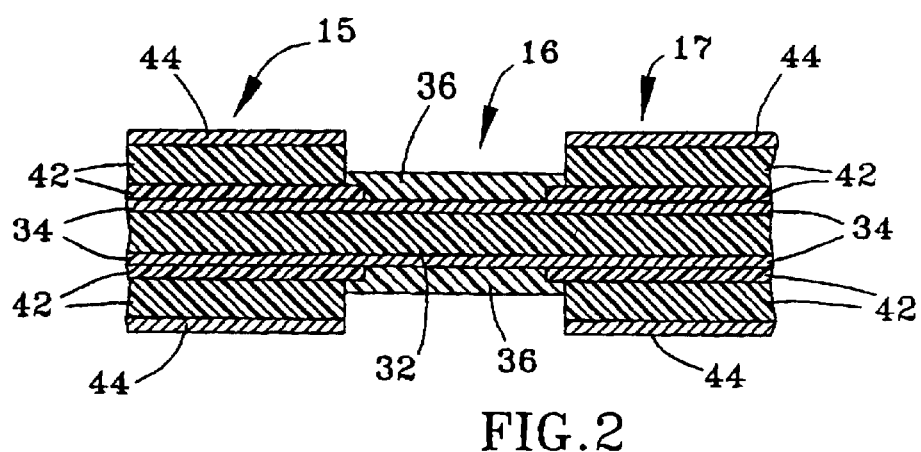
FIGS. 2 and 3 are more detailed cross-sectional and plan views, respectively, of portions of the substrate of FIG. 1.

According to the invention, the substrate 14 preferably has a laminate construction (e.g., a PWB) that defines multiple discrete regions, such as the three regions 15, 16 and 17 represented in FIGS. 1 and 2. A first of the regions 15 is completely surrounded by a second of the regions 16, which is thinner and, according to the invention, significantly more freely able to move than either the first region 15 or the remaining third region 17, which completely surrounds the second region 16. As a result of this construction, the relatively rigid first region 15 of the substrate 14 is physically supported by the flexible second region 16, which in turn is physically supported by the relatively rigid third region 17, with the effect that the first region 15 is almost completely mechanically decoupled from the third region 17. The chip 12 is depicted in FIG. 1 as being attached solely to the first region 15 of the substrate 14, such that the chip 12 and its solder connections 18 are also mechanically decoupled from the third region 17. At the same time, the flexible second region 16 does not mechanically decouple the first region 15 and the chip 12 attached thereto from the housing 20–22 (if used to support the third region 17), which is much stiffer than the third region 17.

A pedestal 26 is shown as projecting into the interior of the housing 20–22 from the upper housing member 20 (as viewed in FIG. 1), and engages the entire topside of chip 12. While shown as being integrally formed as a portion of the upper housing member 20, the pedestal 26 could be separately formed and subsequently attached to the housing member 20. A number of convection cooling fins 28 are shown as projecting outwardly from the upper housing member 20.

The lower housing member 22 (as viewed in FIG. 1) encloses a biasing member 30 that contacts the first region 15 of the substrate 14 and urges the chip 12 on the first region 15 into engagement with the pedestal 26. As depicted in FIG. 1, the biasing member 30 contacts an interior wall of the lower housing member 22 so as to be braced for engagement with the first region 15 of the substrate 14. The biasing member 30 is shown as contacting essentially the entire facing surface of the first region 15 so that, in cooperation with the pedestal 26, a generally uniform load is applied to the chip 12 and the first region 15 of the substrate 14. The biasing member 30 is preferably an elastomeric member as depicted in FIG. 1, with a particularly suitable material for the biasing member 30 being a silicone-based polymer that can be preformed or formed in place. However, other types of biasing elements could be used, such as a spring.

From the structure described above, it can be seen that the biasing member 30 serves to bias the chip 12 into engagement with the pedestal 26, so that the pedestal 26 is able to conduct heat away from the chip 12 and into the housing member 20. For this reason, at least the upper housing member 20 and pedestal 26 28 are preferably formed of a material that readily conducts heat, such as a metal or a metal-filled plastic. To facilitate manufacturing, the entire upper housing member 20, including integrally-formed pedestal 26 and fins 28, can be molded, stamped or formed from a conductive material, such as aluminum. While the lower housing member 22 need not be formed of a thermally-conductive material in the embodiment shown, it is foreseeable to do so to provide a larger heat sink. The lower housing member 22 can also be equipped with cooling fins to further promote heat dissipation to the environment. The choice of material for the lower housing member 22 depends in part on the type of biasing member 30 used, since a biasing member 30 formed of a highly conductive material, e.g., metal, would promote conduction of heat back to the chip 12 if the lower housing member 22 is also thermally conductive.

The load applied by the biasing member 30 to the chip 12 affects the heat transfer across the interface between the chip 12 and its pedestal 26, with higher loads promoting conduction. However, the applied load must not be so high as to be structurally detrimental to the chip 12 and substrate 14. Generally, a load of about three to five pounds (about 13 to about 22 Newtons) should typically be acceptable, though lower and higher loads are foreseeable. To further promote heat transfer between the chip 12 and pedestal 26, a thermally-conductive interface material 40 is also preferably provided between the topside of the chip 12 and its pedestal 26 to promote heat transfer therebetween. Importantly, a feature of this invention is that the interface material 40 is not required to decouple lateral mechanical strains that arise as a result of different thermal expansions and movement between the chip 12, substrate 14 and pedestal 26. Instead, the arrangement of the first, second and third regions 15, 16 and 17 of the substrate 14 provides the desired decoupling effect by isolating the rigid first region 15 to which the chip 12 is attached with the second region 16, which is sufficiently flexible to accommodate differences in thermal expansion as well as variations in pedestal height and flip chip planarities to achieve uniform contact between the chip 12 and pedestal 26. As a result, a variety of material other than lubricants can be used as the interface material 40. Notable examples include highly-conductive films, gels and phase-changing materials, including those having fillers with a Mohs hardness of greater than 5, as well as conductive adhesives that have been incompatible with prior isolation techniques. Particular examples include XTIG-7500 available from the Bergquist Company, ATTA available from Browne Technology, Inc. (btechcorp.), M-220 from Thermoset Advanced Electronic Materials, and 4173 from Dow. It is foreseeable that a variety of other heat-conducting materials, both lubricating and nonlubricating, could be used.

FIG. 2 represents a particular construction for the substrate 14, by which the regions 15, 16 and 17 acquire their differences in rigidity as a result of the number and type of laminate layers that form them. As represented in FIG. 2, the first and third regions 15 and 17 are essentially identical, containing the same number, type and arrangement of dielectric and conductor layers 42 and 44 built up on a base stock comprising a pair of conductor layers 34 laminated to a dielectric layer 32. In contrast, the flexible second region 16 is shown as sharing only the dielectric and conductor layers 32 and 34 with the rigid first and third regions 15 and 17. As a result of having one or more of the additional layers 42 and 44 depicted in FIG. 2, the first and third regions 15 and 17 of the substrate 14 are more rigid than the second region 16. Suitable dielectric materials for the dielectric layer 32 of the base stock include standard FR4 laminate (epoxy prepreg), polyimide, polyimide prepreg, acrylic, etc., and suitable dielectric materials for the additional dielectric layers 42 include B-stage epoxy and standard FR4 laminate. Suitable electrically conductive materials for the conductor layers 34 and 44 include copper foil. The second region 16 is also depicted in FIG. 2 as having outer polyimide layers 36 that protect the conductor layer 34. All of these materials and associated processing are well known in the art, and therefore will not be discussed in any further detail.

Figure 3:
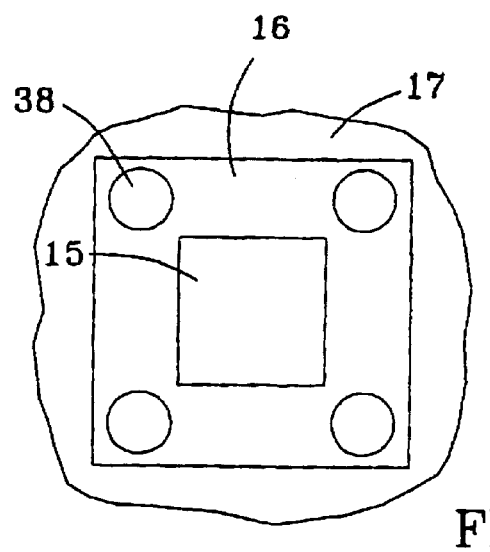

FIG. 3 shows the second region 16 as further including through-holes 38 that are arranged and sized to promote flexing of the second region 16 for optimizing isolation of the first region 15. The through-holes 38 are located at the corners of the second region 16, between areas of the second region 16 where conductors pass to electrically interconnect the first and third regions 15 and 17. The through-holes 38 are depicted as generally have a circular or oval shape that avoid the creation of stress risers, though other shapes are foreseeable. If present, the through-holes 38 increase the flexibility of the flexible second region 16, and therefore the ability of the second region 16 to accommodate tolerance variations, such as between the chip 12 and the pedestal 26.

While circuit substrates having discrete rigid and flexible regions, referred to as "rigid flex constructions," are known in the art, as exemplified by U.S. Pat. No. 3,409,732 to Dahlgren et al. and U.S. Pat. No. 4,800,461 to Dixon et al., their use has generally been limited to providing a circuit board with a flexible peripheral region through which interconnections are made, to provide board-to-board interconnect functions, e.g., to separate digital and analog circuits, and to assist in processing a circuit board assembly which is then broken and folded for placing in a housing. In contrast, the present invention uses the flexible second region 16 to mechanically isolate a rigid (first) region 15 that is preferably sized to carry a single chip 12 (or a chip 12 and filter capacitor, or two or more closely-spaced chips 12) allowing the rigid region 15 (and devices mounted thereto) to move relatively independently with respect to a remaining rigid (third) region 17 of the same substrate 14 in order to compensate for different thermal expansions and movement between the chip 12, substrate 14, and pedestal 26. As a result, the rigid-flexible construction of the substrate 14 serves to reduce the induced stresses that can cause fracturing of the chip 12 and its solder connections 18. The substrate 14 also allows for a greater tolerance for dimensional variations, including those of the pedestal 26 and chip-to-chip stack-up tolerances.

While the invention has been described in terms of a preferred embodiment, it is apparent that other forms could be adopted by one skilled in the art. Accordingly, the scope of the invention is to be limited only by the following claims.

What is claimed is:

1. An electronic assembly comprising:
    a substrate having a first region with conductors thereon, a second region surrounding and supporting the first region, and a third region surrounding and supporting the second region, the second region being more flexible than the first and third regions;
    a flip chip mounted to the first region of the substrate, the flip chip having solder connections on a first surface thereof that are registered with the conductors on the first region of the substrate, the flip chip having a second surface oppositely disposed from the first surface;
    a heat-conductive member thermally contacting the second surface of the flip chip; and
    means contacting the first region of the substrate for biasing the flip chip into thermal contact with the heat-conductive member.

2. The electronic assembly according to claim 1, wherein the substrate is a laminate structure comprising multiple laminate layers, at least one of the laminate layers being common to the first and second regions of the substrate, at least a second of the laminate layers being present in the first region and not in the second region.

3. The electronic assembly according to claim 2, wherein the first region of the substrate contains more of the multiple laminate layers than the second region of the substrate.

4. The electronic assembly according to claim 2, wherein the at least one laminate layer comprises at least one dielectric layer and at least one conductor layer.

5. The electronic assembly according to claim 1, wherein the substrate is a laminate structure comprising multiple laminate layers, at least one of the laminate layers being common to the first, second and third regions of the substrate at least a second of the laminate layers being present in the first and third regions and not in the second region.

6. The electronic assembly according to claim 5, wherein the first and third regions of the substrate contain more of the multiple laminate layers than the second region of the substrate.

7. The electronic assembly according to claim 1, wherein the first region of the substrate is sized to accommodate the chip and not additional semiconductor devices.

8. The electronic assembly according to claim 1, further comprising a thermally-conductive nonlubricant between the second surface of the flip chip and the heat-conductive member.

9. The electronic assembly according to claim 1, further comprising through-holes formed in the second region so as to increase the flexibility of the second region.

10. The electronic assembly according to claim 1, further comprising a housing that encloses the substrate, the flip chip and the biasing means.

11. The electronic assembly according to claim 10, wherein the heat-conductive member is a pedestal protruding from the housing.

12. The electronic assembly according to claim 10, wherein a portion of the housing defines the heat-conductive member.

13. The electronic assembly according to claim 10, wherein the biasing means is braced by the housing into contact with the substrate.

14. An electronic assembly comprising:
    a housing having an interior;
    a heat-conductive pedestal projecting into the interior of the housing;
    a substrate within the interior of the housing, the substrate having a first region having conductors thereon, a second region surrounding and supporting the first region, and a third region surrounding and supporting the second region, the substrate having a laminate structure comprising multiple laminate layers, at least one of the laminate layers being a dielectric layer common to the first, second and third regions of the substrate, at least a second of the laminate layers being a conductor layer common to the first, second and third regions of the substrate, at least a third of the laminate layers being a dielectric layer present in the first and third regions and not in the second region, the third laminate layer causing the first and third regions to be more rigid than the second region such that the second region is more flexible than the first and third regions;
    a flip chip mounted to the first region of the substrate, the flip chip having solder connections on a first surface thereof that are registered with the conductors of the first region, the flip chip having a second surface oppositely disposed from the first surface and thermally contacting the heat-conductive pedestal;
    a thermally-conductive nonlubricant between the second surface of the flip chip and the heat-conductive pedestal; and
    an elastomeric biasing member within the housing and contacting a facing surface of the first region of the substrate so as to bias the flip chip into thermal contact with the heat-conductive pedestal.

15. The electronic assembly according to claim 14, wherein the first and third regions of the substrate contain more of the multiple laminate layers than the second region of the substrate.

16. The electronic assembly according to claim 14, wherein the first region of the substrate is sized to accommodate the chip and not additional semiconductor devices, the pedestal contacts substantially all of the second surface of the chip through the thermally-conductive nonlubricant, and the biasing member contacts substantially all of the facing surface of the first region of the substrate.

17. The electronic assembly according to claim 14, further comprising through-holes formed in the second region so as to increase the flexibility of the second region.

18. The electronic assembly according to claim 14, wherein a portion of the housing defines the pedestal.

19. The electronic assembly according to claim 14, wherein the biasing member is braced by the housing into contact with the first region of the substrate.

20. The electronic assembly according to claim 14, wherein the thermally-conductive nonlubricant is chosen from the group consisting of conductive films, gels, phase-changing materials, and conductive adhesives.

* * * * *